(12) United States Patent
Baek et al.

(10) Patent No.: US 12,300,689 B2
(45) Date of Patent: May 13, 2025

(54) DUAL COOL POWER MODULE WITH STRESS BUFFER LAYER

(71) Applicant: SEMICONDUCTOR COMPONENTS INDUSTRIES, LLC, Scottsdale, AZ (US)

(72) Inventors: Jonghwan Baek, Bucheon (KR); JeongHyuk Park, Incheon (KR); Seungwon Im, Seoul (KR); Keunhyuk Lee, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 85 days.

(21) Appl. No.: 18/301,939

(22) Filed: Apr. 17, 2023

(65) Prior Publication Data
US 2023/0253393 A1    Aug. 10, 2023

Related U.S. Application Data (62) Division of application No. 17/247,797, filed on Dec. 23, 2020, now Pat. No. 11,658,171.

(51) Int. Cl.
| | |
|---|---|
| *H01L 23/495* | (2006.01) |
| *H01L 23/00* | (2006.01) |
| *H01L 23/31* | (2006.01) |
| *H01L 23/367* | (2006.01) |
| *H01L 25/00* | (2006.01) |
| *H01L 25/18* | (2023.01) |

(52) U.S. Cl.
CPC .......... *H01L 25/18* (2013.01); *H01L 23/3107* (2013.01); *H01L 23/3677* (2013.01); *H01L 23/49524* (2013.01); *H01L 23/49575* (2013.01); *H01L 24/32* (2013.01); *H01L 24/33* (2013.01); *H01L 25/50* (2013.01); *H01L 2224/32245* (2013.01); *H01L 2224/33181* (2013.01)

(58) Field of Classification Search
CPC . H01L 25/18; H01L 23/3107; H01L 23/3677; H01L 23/49524; H01L 23/49575; H01L 24/32; H01L 24/33; H01L 25/50; H01L 2224/32245; H01L 2224/33181
USPC ......................................................... 257/675
See application file for complete search history.

(56) References Cited

U.S. PATENT DOCUMENTS

| | | | |
|---|---|---|---|
| 7,456,492 B2 * | 11/2008 | Mochida | ................. H01L 24/33 257/659 |
| 9,041,183 B2 | 5/2015 | Liang et al. | |
| 10,276,522 B2 * | 4/2019 | Wang | ................. H01L 23/3735 |

(Continued)

OTHER PUBLICATIONS

U.S. Appl. No. 17/247,797, filed Dec. 23, 2020.

(Continued)

*Primary Examiner* — Caleb E Henry
*Assistant Examiner* — Dilinh P Nguyen
(74) *Attorney, Agent, or Firm* — Brake Hughes Bellermann LLP (57) ABSTRACT

Described implementations provide wireless, surface mounting of at least two semiconductor die on die attach pads (DAPs) of the semiconductor package, where the at least two semiconductor die are electrically connected by a clip. A stress buffer layer may be provided on the clip, and a heatsink may be provided on the stress buffer layer. The heatsink may be secured with an external mold material.

18 Claims, 9 Drawing Sheets

(56) References Cited

U.S. PATENT DOCUMENTS

| | | | |
|---|---|---|---|
| 10,818,573 B2* | 10/2020 | Tsuyuno | H01L 23/29 |
| 2009/0025770 A1 | 1/2009 | Lofy | |
| 2013/0015468 A1 | 1/2013 | Kikuchi | |
| 2019/0157196 A1* | 5/2019 | Sonehara | H01L 23/4952 |

OTHER PUBLICATIONS

3M Company, "The Next Level of Thermal Management," Boron Niride Cooling Fillers, for thermally conductive and electrically insulating plastics and adhesives, [Add Date].

3M Company, "The cool science of thermally conductive materials," 3M Boron Nitride Cooling Fillers Thermal Materials, [Add Date].

Sekisui Chemibal Co., Ltd., "Heat release fin," https://www.sekisui.co.jp/lj/eng/product/hrf/index.html, 2016.

* cited by examiner

DUAL COOL POWER MODULE WITH STRESS BUFFER LAYER

RELATED APPLICATIONS

This application is a divisional application of U.S. patent application Ser. No. 17/247,797, filed Dec. 23, 2020, which is incorporated by reference herein in its entirety.

TECHNICAL FIELD

This description relates to semiconductor packaging techniques for power modules.

BACKGROUND

Semiconductor devices have been developed for use in various applications associated with power supply and power management. For example, power modules may use a combination of a transistor and a diode, such as an Insulated Gate Bipolar Transistor (IGBT) and a Fast Recovery Diode (FRD).

Semiconductor devices packaged within a power module may have high demands in terms of electrical, mechanical, and thermal reliability. In particular, such semiconductor device packages may suffer from mismatches in coefficients of thermal expansion (CTE) between two or more different types of materials bonded to one another within the packages. Moreover, such semiconductor device packages may be difficult to assemble, and may provide insufficient thermal dissipation.

SUMMARY

According to one general aspect, a semiconductor device package includes a leadframe and a direct bonded metal (DBM) substrate connected to the leadframe. A first semiconductor die is disposed on a patterned metal layer of the DBM, and a second semiconductor die disposed on the patterned metal layer of the DBM. A clip is electrically connected to the first semiconductor die and the second semiconductor die, and a stress buffer layer is disposed on the clip. A heatsink is disposed on the clip with the stress buffer layer disposed therebetween, and a mold material encapsulates the first semiconductor die, the second semiconductor die, the clip, and the stress buffer layer, and partially encapsulates the leadframe, the DBM substrate, and the heatsink.

According to another general aspect, a semiconductor device package includes a leadframe and a first pin-fin heatsink connected to a first surface of the leadframe. A first semiconductor die is disposed on a second surface of the leadframe that is opposed to the first surface, and a second semiconductor die is disposed on the second surface. A clip is electrically connected to the first semiconductor die and the second semiconductor die, and a stress buffer layer disposed on the clip. A second pin-fin heatsink is disposed on the clip with the stress buffer layer disposed therebetween, and a mold material encapsulates the first semiconductor die, the second semiconductor die, the clip, and the stress buffer layer, and partially encapsulates the leadframe, the first pin-fin heatsink, and the second pin-fin heatsink.

According to another general aspect, a method of making a semiconductor device package includes attaching a first heatsink to a leadframe, attaching a first semiconductor die to the leadframe, and attaching a second semiconductor die to the leadframe. The method includes attaching a clip to the first semiconductor die and the second semiconductor die, and forming a stress buffer layer on the clip, the stress buffer layer including an electrically-isolating material. The method includes attaching a second heatsink on the stress buffer layer, the second heatsink including a pin-fin heatsink, and encapsulating the first semiconductor die, the second semiconductor die, the clip, and the stress buffer layer with a mold material, and partially encapsulating the leadframe, the first heatsink, and the second heatsink.

The details of one or more implementations are set forth in the accompanying drawings and the description below. Other features will be apparent from the description and drawings, and from the claims.

DETAILED DESCRIPTION

Power module packaging should provide high levels of electrical, mechanical, and thermal reliability, in a cost-efficient and space-efficient manner. Accordingly, described implementations provide wireless, surface mounting of at least two semiconductor devices (e.g., two semiconductor die) on die attach pads (DAPs) of the semiconductor package, where the at least two semiconductor die are electrically connected by a clip. A stress buffer layer may be provided on the clip, and a heatsink may be provided on the stress buffer layer. The heatsink may be secured with an external mold material. In this way, the at least two semiconductor die may be electrically isolated, CTE mismatches may be minimized, and suitable thermal dissipation may be provided.

In some implementations, the heatsink disposed on the stress buffer layer may be a pin-fin heatsink. In some implementations, the heatsink is exposed at a first package surface of the semiconductor package, and a second heatsink is provided at a second package surface of the semiconductor package, that is opposed to the first package surface. The semiconductor package may include a leadframe, and the first package surface and the second (opposed) package surface may be defined with respect to a corresponding leadframe surface and opposed leadframe surface, respectively.

In some implementations, the second heatsink may include a direct-bonded metal (DBM), such as a direct bonded copper (DBC), substrate. In other implementations, the second heatsink may include a pin-fin heatsink.

When the second heatsink includes a DBM substrate, such as a DBC substrate, the DAPs may be provided using a metal surface of the DBM, e.g., a copper surface of the DBC substrate, e.g., by desired patterning of the copper surface. When the second heatsink includes a pin-fin heatsink, the DAPs may be provided on the leadframe surface of the leadframe.

The described implementations minimize electrical failures due to arcing and other breakdown events. Described implementations reduce or eliminate inductances that may otherwise make high-speed switching unreliable, and enable efficient electrical performance, including high-current capacity. Moreover, described implementations provide flexible design alternatives for thermal dissipation, while providing a straightforward process flow for assembly, with minimal soldering requirements.

Figure 1:
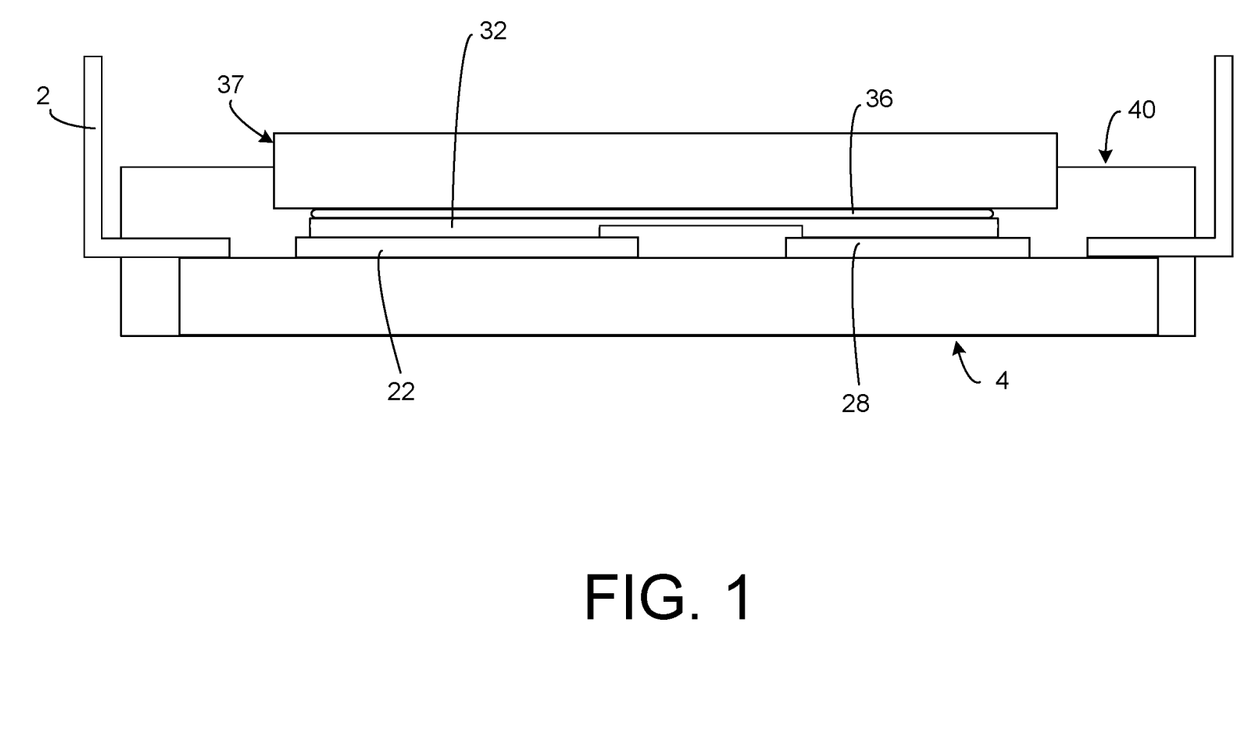
FIG. 1 is a cross-sectional view of an example implementation of a dual cool power module with a stress buffer layer.

FIG. 1 is a cross-sectional view of an example implementation of a dual cool power module with a stress buffer layer. FIG. 1 is a simplified and abstracted version of the various embodiments described herein, so that more detailed example aspects are illustrated and described with respect to FIGS. 2A-9.

In FIG. 1, a leadframe 2 is attached to a heatsink 4 and a heatsink 37. A first semiconductor die 22 and a second semiconductor die 28 are attached by a metal clip 32. A stress buffer layer 36 is disposed between the clip 32 and the heatsink 37. Mold material 40 is disposed around, and encapsulates and packages, at least a portion(s) of the heatsinks 4, 37 and the leadframe 2. The mold material 40 further encapsulates the semiconductor die 22, 28, the clip 32, and the stress buffer layer 36. As described below, the stress buffer layer 36 may be provided using a high thermal and electrical isolation material.

In FIG. 1, the heatsinks 4, 37 are illustrated conceptually, but may be understood to represent more specific types of heatsinks, such as a pin-fin heatsink, or a DBC substrate, which can be used, at least in part, as a heatsink. Also in FIG. 1, the heatsink 4 is illustrated as being attached to the leadframe 2, while the two semiconductor die 22, 28 are illustrated as being attached to the heatsink 4. However, in some implementations, the leadframe 2 may be extended toward the two semiconductor die 22, 28, and one or both of the semiconductor die 22, 28 may be mounted on a surface of the leadframe 2.

Although FIG. 1 illustrates the two semiconductor die 22, 28, it will be appreciated that three or more semiconductor die may be included within a single package. The semiconductor die 22, 28 may be connected in parallel with one another, or in series. At least one of the semiconductor die 22, 28 may be flip-mounted and wireless mounted.

By providing the stress buffer layer 36 between the clip 32 and the heatsink 37, CTE mismatch may be avoided between the semiconductor die 22, 28, the clip 32, and the heatsink 37. The heatsink 37 may be secured at least partially by the mold material 40. That is, although the heatsink 37 extends at least partially from the mold material 40, the mold material 40 encapsulates at least a sufficient portion of the heatsink 37 to maintain the heatsink 37 within the overall package.

Further, the clip 32 with the stress buffer layer 36 provides electrical isolation of the semiconductor die 22, 28 during operation. For example, a user touching the heatsink 37 would be prevented from receiving an electric shock, and operations of the semiconductor die 22, 28 would not be short-circuited or otherwise disrupted.

Figure 2A:
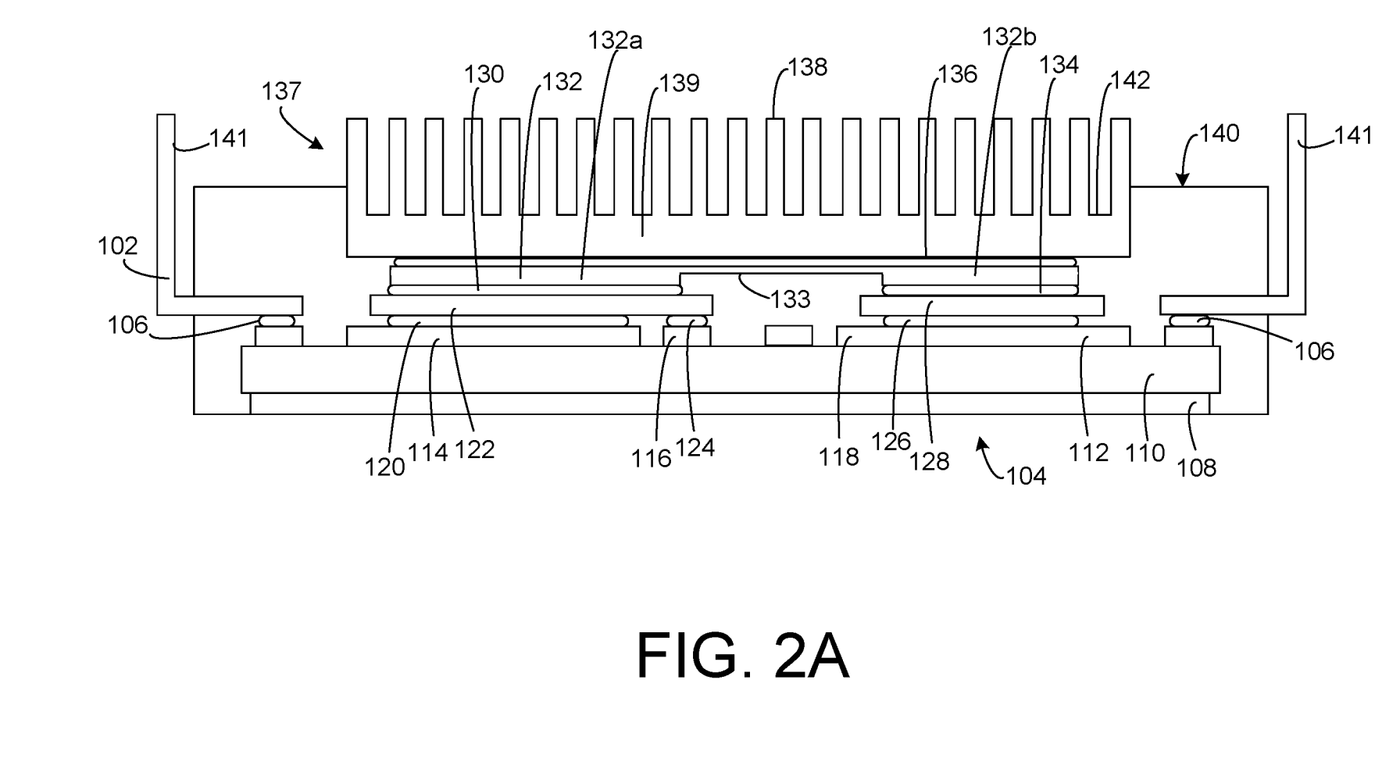
FIG. 2A is a cross-sectional view of a first example implementation of the dual cool power module with a stress buffer layer of FIG. 1.

FIG. 2A is a cross-sectional view of a first example implementation of the dual cool power module with a stress buffer layer of FIG. 1. In FIG. 2A, a leadframe 102 is attached to a DBC substrate 104, using solder connections 106. As shown, the DBC substrate 104 includes a first copper layer 108, a dielectric layer 110, and a second copper layer 112. The second copper layer 112 is patterned to include die attach pads (DAPs) 114, 116, and 118.

Further in FIG. 2A, the DAP 114 is attached by a solder layer 120 to a first semiconductor die 122. The DAP 116 is attached by a solder layer 124 to the first semiconductor die 122. For example, the first semiconductor die 122 may represent an IGBT, or a metal-oxide-semiconductor field effect transistor (MOSFET). Then, the DAP 116 may be attached to a gate of the first semiconductor die, while the DAP 114 is connected to the source or drain of the first semiconductor die 122.

The DAP 118 may be attached by a solder layer 126 to a second semiconductor die 128. For example, the second semiconductor die 128 may represent a fast recovery diode (FRD).

The first semiconductor die 122 may be attached by a solder layer 130 to a clip 132. The second semiconductor die 128 may be attached by a solder layer 134 to the clip 132. Accordingly, the clip 132 electrically connects the first semiconductor die 122 and the second semiconductor die 128.

In various implementations, the first semiconductor die 122 and the second semiconductor die 128 may be connected in series, or in parallel. In various implementations, the second copper layer 112 of the DBC substrate 104 may be patterned in any desired manner to enable required electrical connections between the first semiconductor die 122 and the second semiconductor die 128. For example, the DAP 114 and the DAP 118 may be formed using a single portion of the second copper layer 112. Further, portions of the second copper layer 112 may be electrically connected to the leadframe 102 as well as to the first semiconductor die 122 and/or the second semiconductor die 128, so as to enable external electrical connections via the leadframe 102.

A stress buffer layer 136 may be provided on the clip 132, with a heatsink 137 provided on the stress buffer layer 136. In the example of FIG. 2A, the heatsink 137 includes a pin-fin heatsink, with fins 138 attached to a base 139. That is, as shown, the fins 138 are parallel to one another and perpendicular to a surface of the base 139.

An encapsulating mold material 140 surrounds and encloses the various structures of FIG. 2A just described. For example, an Epoxy Molding Compound (EMC) mold material may be used. Then, as shown, the mold material 140 encapsulates the leadframe 102, except for exposed leads 141 to be used for external electrical connections. The mold material 140 may be formed so as to expose the copper layer 108 of the DBC substrate 104, thereby enhancing thermal dissipation.

Further in FIG. 2A, the mold material 140 at least partially encloses the pin-fin heatsink 137 and the DBC substrate 104, including, in the latter case, being aligned with, and therefore exposing, the copper layer 108 of the DBC 104. Further in the example of FIG. 2A, the mold material 140 (e.g., a top surface of the mold material 140) extends past (or above) an interface 142 (e.g., a surface aligned with the bottoms of the recesses) of the pin-fin heatsink 137 at which the fins 138 intersect the base 139 of the pin-fin heatsink 137.

Accordingly, the package of FIG. 2A provides a stable, reliable connection of the DBC substrate 104. The package also provides a stable, reliable connection of the heatsink 137 to the clip 132, while using the stress buffer layer 136. For example, the stress buffer layer 136 may include a thermally conductive and electrically isolating material.

In FIG. 2A, the pin-fin heatsink 137 has a lateral length that is less than a lateral length of the DBC substrate 104. Further, the pin-fin heatsink 137 laterally extends beyond a length of the clip 132 (and of the stress buffer layer 136), at both ends thereof.

The clip 132 is of unitary (or monolithic) construction, and includes a connection portion 133 (which is disposed between end portions) that is thinner than either end portion 132a or 132b of the clip 132, which are connected, respectively, to the two semiconductor die 122, 128. Accordingly, the clip 132 provides a flexible mechanical and electrical connection between the semiconductor die 122 and the semiconductor die 128, which is capable of absorbing undesired external stresses on the package.

Figure 2B:
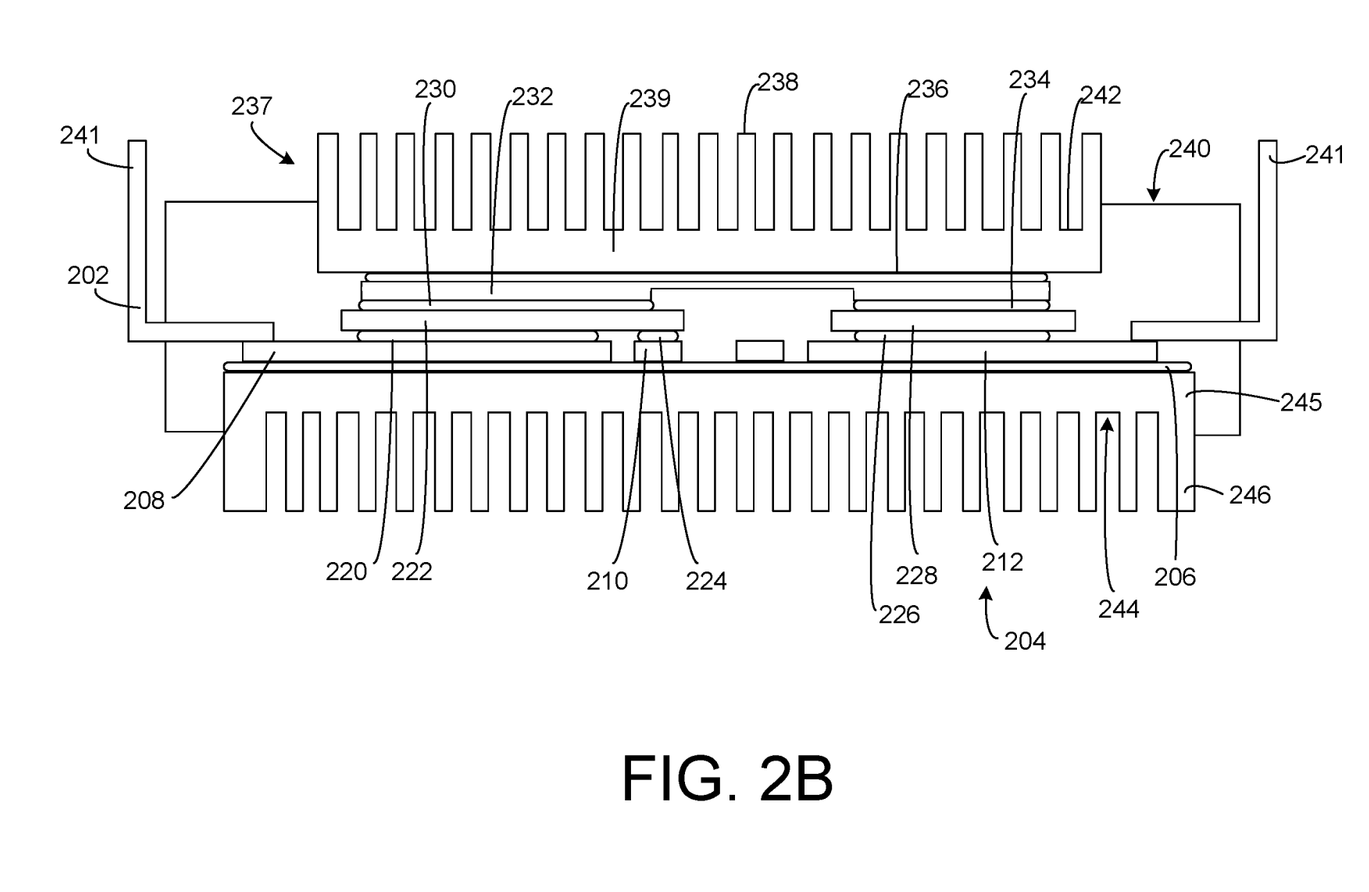
FIG. 2B is a cross-sectional view of a second example implementation of the dual cool power module with a stress buffer layer of FIG. 1.

FIG. 2B is a cross-sectional view of a second example implementation of the dual cool power module with a stress buffer layer of FIG. 1. In FIG. 2B, a leadframe 202 is attached to a pin-fin heatsink 204, using a stress buffer layer 206. As shown, the pin-fin heatsink 204 may be connected using the stress buffer layer 206 to a leadframe portion 208 of the leadframe 202, and to a leadframe portion 210 of the leadframe 202, and to a leadframe portion 212 of the leadframe 202.

Further in FIG. 2B, the leadframe portion 208 provides a DAP that is attached by a solder layer 220 to a first semiconductor die 222. The DAP 210 is attached by a solder layer 224 to the first semiconductor die 222. For example, the first semiconductor die 222 may represent an IGBT, or a metal-oxide-semiconductor field effect transistor (MOSFET). Then, the leadframe portion 210 may be attached to a gate of the first semiconductor die, while the leadframe portion 208 is connected to the source or drain of the first semiconductor die 222.

The leadframe portion 212 may provide a DAP and may be attached by a solder layer 226 to a second semiconductor die 228. For example, the second semiconductor die 228 may represent a fast recovery diode (FRD).

The first semiconductor die 222 may be attached by a solder layer 230 to a clip 232. The second semiconductor die 228 may be attached by a solder layer 234 to the clip 232. Accordingly, the clip 232 electrically connects the first semiconductor die 222 and the second semiconductor die 228. For example, when the first semiconductor die 222 incudes a transistor, such as an IGBT, and the second semiconductor die 228 includes a FRD, then the clip 232 may be connected to the drain or source of such an IGBT and to an anode of the FRD, while the cathode of the FRD is connected to the DAP 212, as described above with respect to FIG. 2A.

A stress buffer layer 236 may be provided on the clip 232, with a heatsink 237 provided on the stress buffer layer 236. In the example of FIG. 2, the heatsink 237 includes a pin-fin heatsink, with fins 238 attached to a base 239. That is, as shown, the fins 238 are parallel to one another and perpendicular to a surface of the base 239.

An encapsulating mold material 240 surrounds and encloses the various structures of FIG. 2B just described. Specifically, as shown, the mold material 240 encapsulates the leadframe 202, except for exposed leads 241 to be used for external electrical connections.

Further in FIG. 2B, the mold material 240 at least partially encloses the pin-fin heatsink 237 and the pin-fin heatsink 204. Specifically, in the example of FIG. 2, as in FIG. 1, the mold material 240 extends past an interface 242 of the pin-fin heatsink 237 at which the fins 238 intersect the base 239 of the pin-fin heatsink 237.

Further, in the example of FIG. 2B, the mold material 240 (e.g., a top surface of the mold material 140) extends past (or above) an interface 242 (e.g., a surface aligned with the bottoms of the recesses) of the pin-fin heatsink 204 at which fins 246 intersect a base 245 of the pin-fin heatsink 204.

Accordingly, the package of FIG. 2B provides a stable, reliable connection of the heatsink 237 to the clip 232, while using the stress buffer layer 236. The package of FIG. 2B further provides a stable, reliable connection of the heatsink 204 to the leadframe 202, using the stress buffer layer 206. For example, the stress buffer layers 236 and 206 may include the types of thermally conductive and electrically isolating material described above with respect to the stress buffer layer 136 of FIG. 2A.

Figure 3:
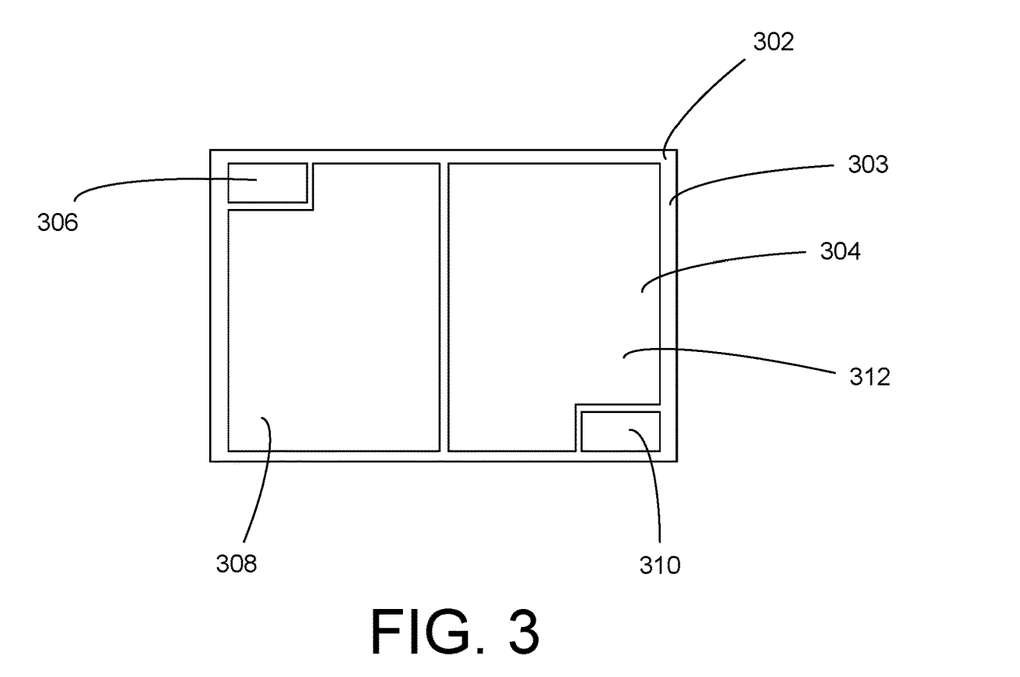
FIG. 3 illustrates a first example operation for assembling an implementation of the example of FIG. 1.

FIG. 3 illustrates a first example operation for assembling an implementation of the example of FIG. 1. In FIG. 3, DBC 302 includes a ceramic layer 303 and a copper layer 304. The copper layer 304 is patterned into portion 306, portion 308, portion 310, and portion 312. It will be appreciated that any desired patterning of the copper layer 304 may be implemented, to accommodate specific semiconductor die and connections therebetween, and to facilitate desired connections to an external leadframe.

Figure 4:
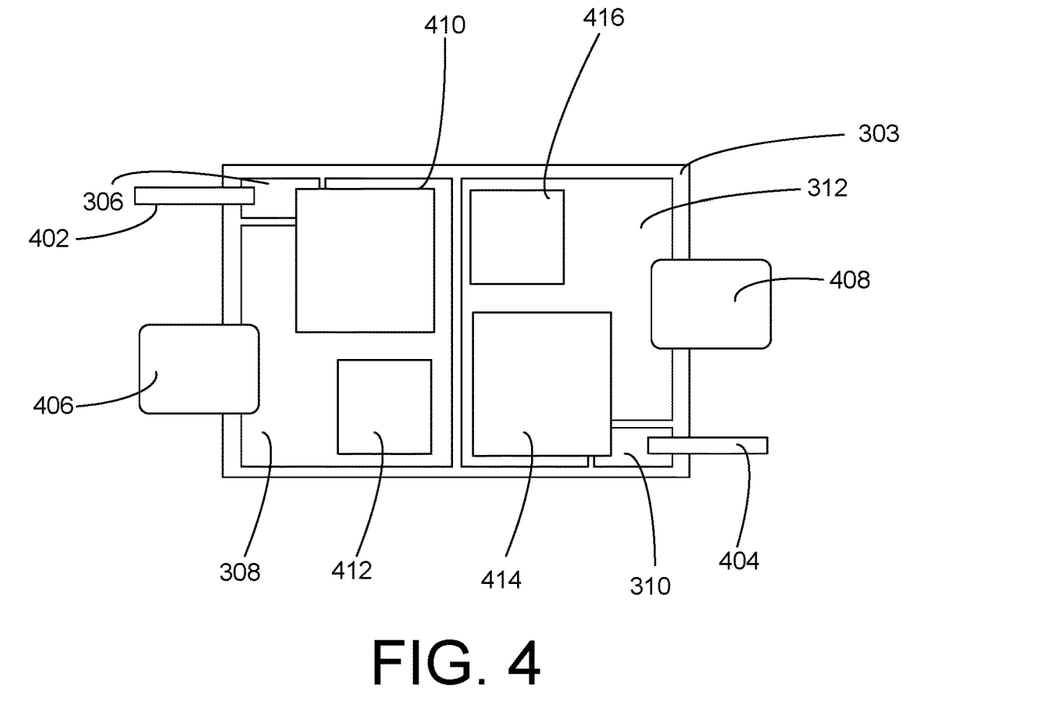
FIG. 4 illustrates a second example operation for assembling an implementation of the example of FIG. 1.

FIG. 4 illustrates a second example operation for assembling an implementation of the example of FIG. 1. In FIG. 4, leadframe lead 402 is soldered to the patterned portion 306, while leadframe lead 404 is soldered to the patterned portion 310. Further, leadframe lead 406 is soldered to the patterned portion 308, while leadframe lead 408 is soldered to the patterned portion 312. In the example, a transistor 410 (e.g., IGBT) and a FRD 412 are soldered to the patterned portion 308, while a transistor 414 and a FRD 416 are soldered to the patterned portion 312.

Figure 5:
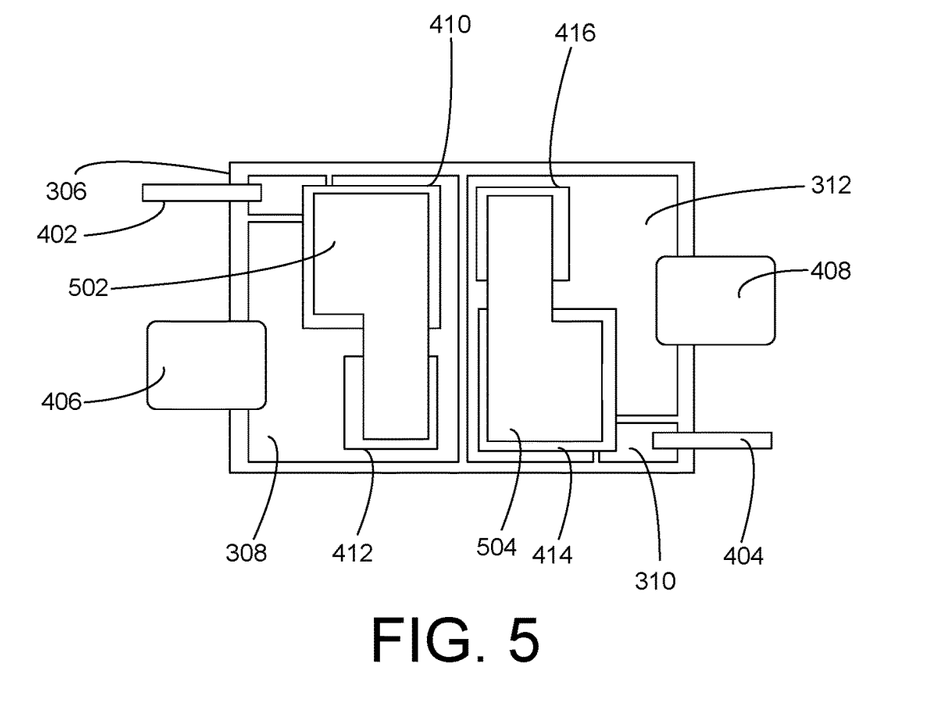
FIG. 5 illustrates a third example operation for assembling an implementation of the example of FIG. 1.

FIG. 5 illustrates a third example operation for assembling an implementation of the example of FIG. 1. In FIG. 5, a clip 502 (similar to the clip 32 of FIG. 1, or 132 of FIG. 2A, or 232 of FIG. 2B) is soldered to the transistor 410, and to the FRD 412. Similarly, a clip 504 is soldered to the transistor 414, and to the FRD 416.

Figure 6:
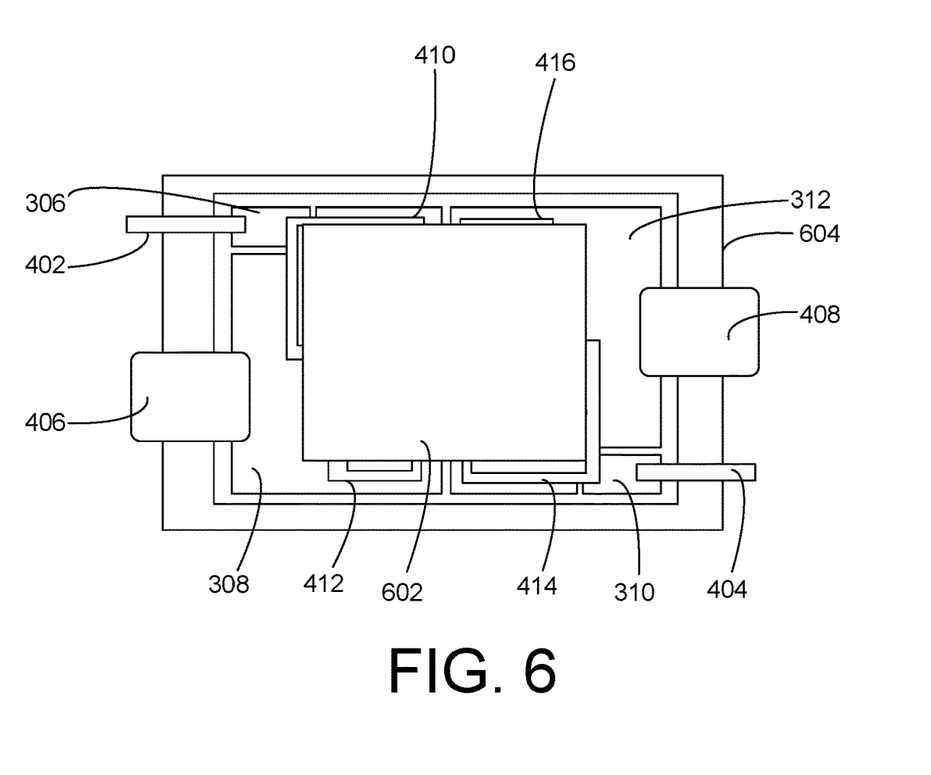
FIG. 6 illustrates a fourth example operation for assembling an implementation of the example of FIG. 1.

FIG. 6 illustrates a fourth example operation for assembling an implementation of the example of FIG. 1. In FIG. 6, a heatsink 602 may be attached using a stress buffer layer (e.g., corresponding to the stress buffer layer 36 of FIG. 1, or the stress buffer layer 136 of FIG. 2A, or 236 of FIG. 2B). The heatsink 602 may represent the type of pin-fin heatsink described and illustrated, above. Mold material 604 may be used to encapsulate the semiconductor package, including securing the heatsink 602.

In FIG. 6, the illustrated top view is a cut-away view that does not illustrate an upper-most layer of the mold material 604, so as not to obscure other details of the illustrated package. A fully assembled top view is shown below in FIG. 8.

Figure 7:
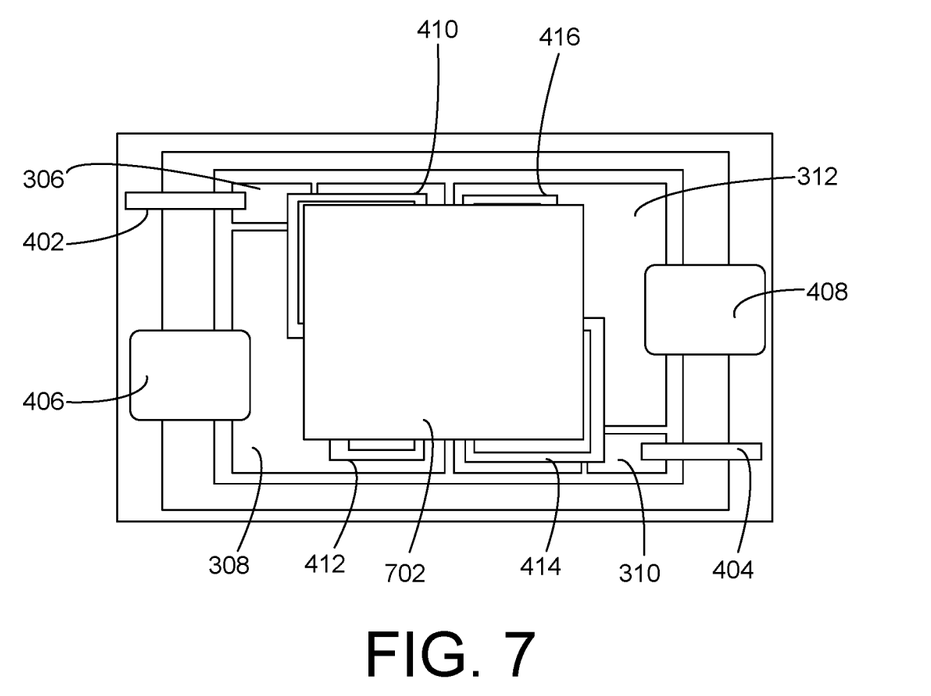
FIG. 7 illustrates an alternate example operation for the fourth example operation of FIG. 6.
Figure 8:
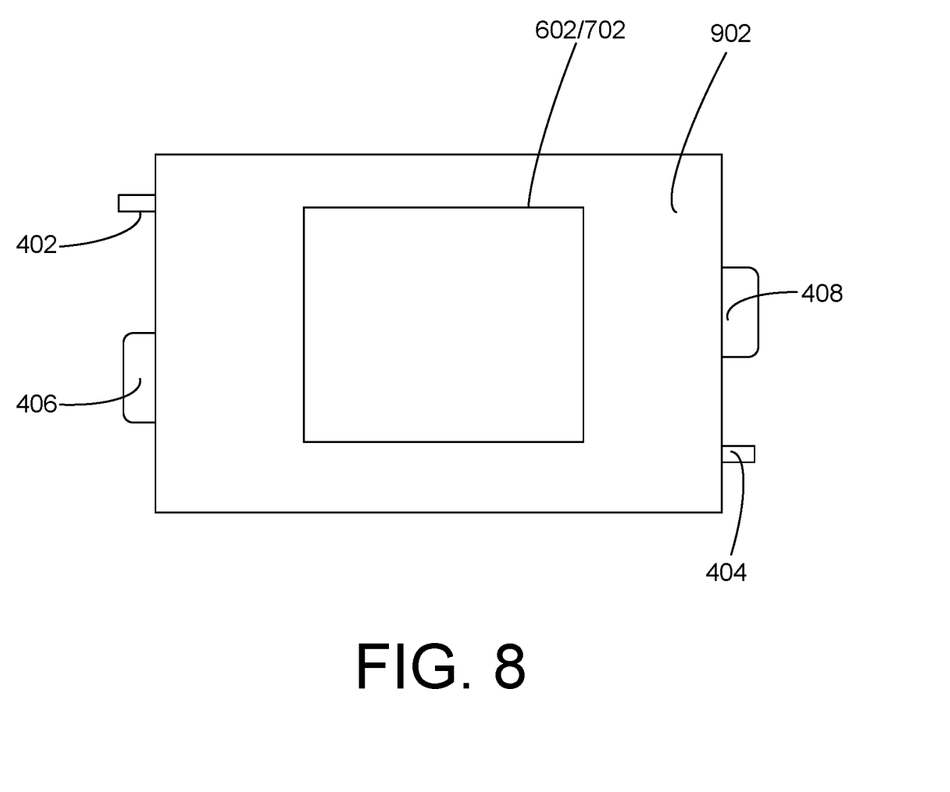
FIG. 8 illustrates a top view of an example package assembled using the operations of FIGS. 3-7.

FIG. 7 illustrates an alternate example operation for the fourth example operation of FIG. 6. That is, the example of FIG. 6 may be suitable for stress buffer layer materials that may be mounted in a sufficient secure process to enable simultaneous molding of the mold material 604. However, if such stress buffer layer materials are not available, it may be necessary to first attach a heatsink 702, and then wait a sufficient period of time before, adding mold material 604 in a separate operation.

Figure 9:
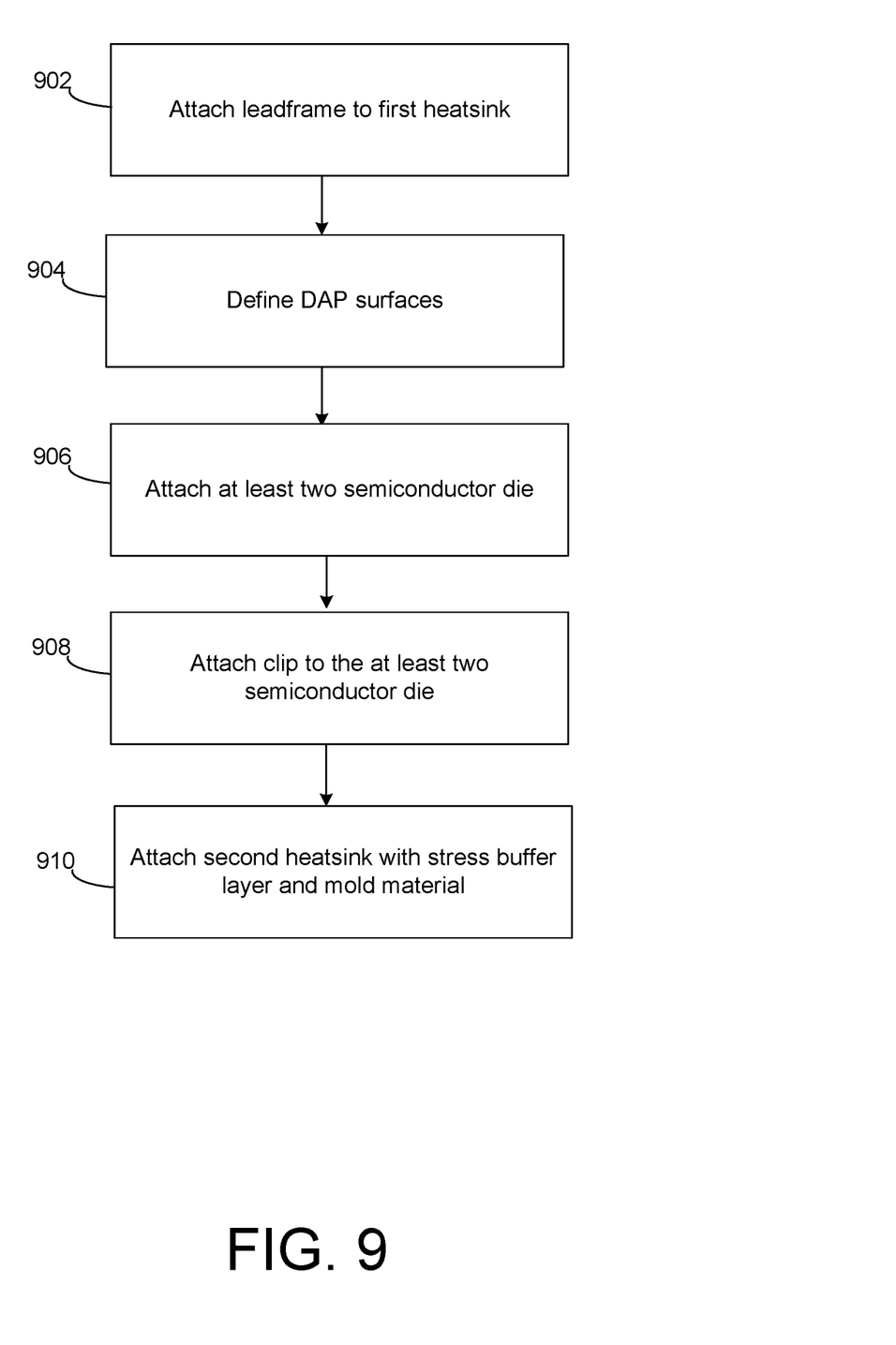
FIG. 9 is a flowchart illustrating first example operations for assembling implementations of the dual cool power module with a stress buffer layer of FIGS. 1-8.

FIG. 9 is a flowchart illustrating first example operations for assembling implementations of the dual cool power module with a stress buffer layer of FIGS. 1-8. In FIG. 9, a leadframe may be attached to a first heatsink (902). For example, the heatsink 4 may be attached to the leadframe 2 of FIG. 1. The heatsink may be a DBC substrate, as in FIG. 2A, or a pin-fin heatsink, as in FIG. 2B. The heatsink may be soldered to the leadframe, or may be attached using a stress buffer layer.

Various DAP surfaces may be defined (904) for attaching two or more semiconductor die. For example, if using a DBC as the first heatsink, a top layer of copper may be patterned in a desired manner. If attaching a pin-fin heatsink to the leadframe as the first heatsink, then suitable locations on the leadframe surface may be designated as DAPs.

At least two semiconductor die may then be attached (906). For example, an IGBT may be flip-attached or flip-chip attached to the pre-defined DAP surfaces, and a FRD may be attached adjacent thereto.

A clip may be attached on the at least two semiconductor die (908). For example, the clip may be soldered to coplanar surfaces of the flip-mounted IGBT and the FRD. A stress buffer layer and mold material may then be used to attach a second heatsink, such as a pin-fin heatsink, during a single operation (910).

Figure 10:
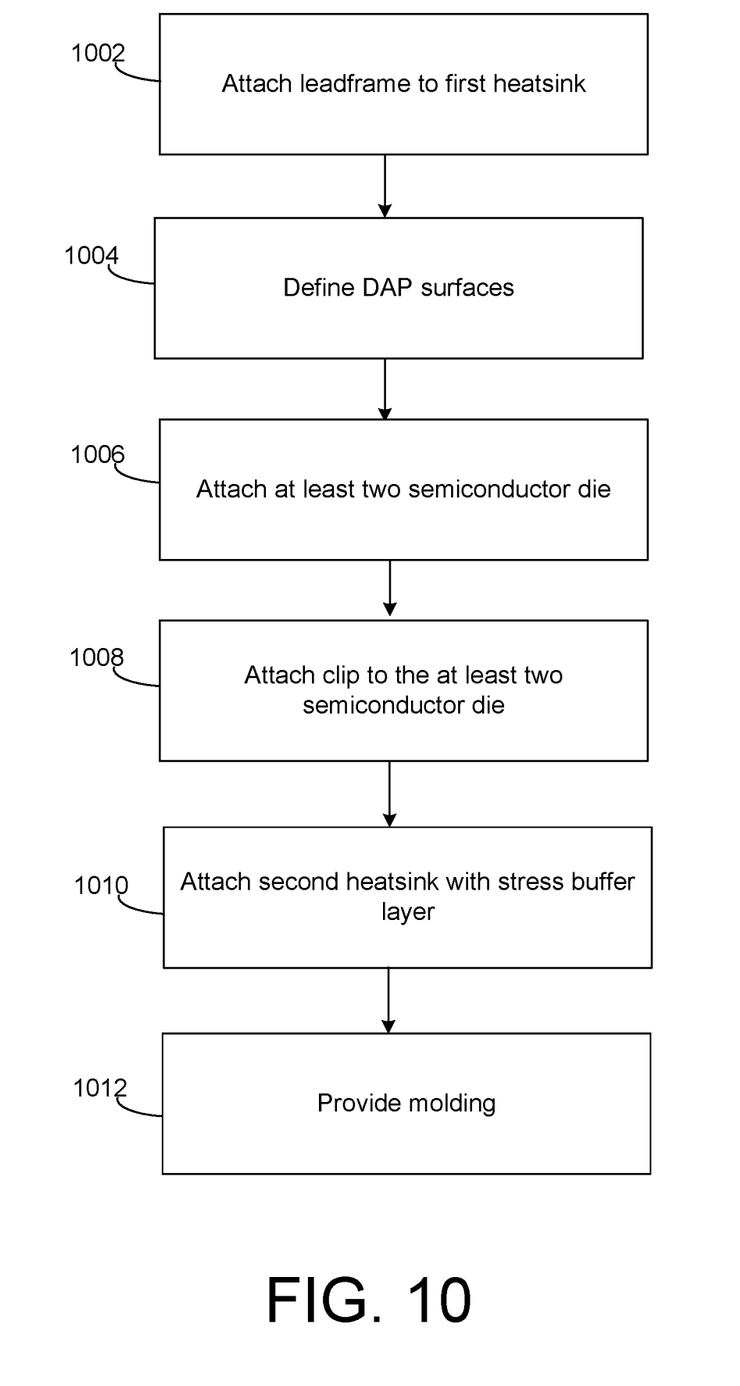
FIG. 10 is a flowchart illustrating second example operations for assembling implementations of the dual cool power module with a stress buffer layer of FIGS. 1-8.

FIG. 10 is a flowchart illustrating second example operations for assembling implementations of the dual cool power module with a stress buffer layer of FIGS. 1-8. As in FIG. 9, in FIG. 10, a leadframe may be attached to a first heatsink (1002). Various DAP surfaces may be defined (1004) for attaching two or more semiconductor die. Then, at least two semiconductor die may then be attached (1006), and a clip may be attached on the at least two semiconductor die (1008).

In FIG. 10, however, as referenced above with respect to FIG. 7, a stress buffer layer may then be used to attach a second heatsink, such as a pin-fin heatsink (1010). Then, mold material may be provided around the package (1012) in a separate, subsequent operation, leaving the external surfaces of the first heatsink and second heatsink exposed.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package, comprising:
a leadframe;
a first pin-fin heatsink disposed on the leadframe;
a first semiconductor die flip-attached to a patterned metal layer of a direct bonded metal (DBM) disposed on the leadframe;
a second semiconductor die disposed on the patterned metal layer of the DBM;
a clip electrically connected to the first semiconductor die and the second semiconductor die and connecting the first semiconductor die, the clip, and the second semiconductor die in series;
an electrically-isolating layer disposed on the clip;
a second pin-fin heatsink disposed on the clip with the electrically-isolating layer disposed therebetween; and
a mold material encapsulating the first semiconductor die, the second semiconductor die, the clip, and the electrically-isolating layer, and partially encapsulating the leadframe, the first pin-fin heatsink, and the second pin-fin heatsink.

2. The semiconductor device package of claim 1, wherein the first semiconductor die is soldered to the leadframe.

3. The semiconductor device package of claim 1, wherein the clip is soldered to the first semiconductor die and the second semiconductor die.

4. The semiconductor device package of claim 1, wherein the first pin-fin heatsink includes a first base with first fins attached thereto at a first surface of the first base, the first fins being parallel to one another and perpendicular to the first base, and further wherein the second pin-fin heatsink includes a second base with second fins attached thereto at a second surface of the first base, the second fins being parallel to one another and perpendicular to the second base.

5. The semiconductor device package of claim 4, wherein the mold material encapsulates the first pin-fin heatsink, including at least the first base, the first surface, and a portion of the first fins, and further wherein the mold material encapsulates the second pin-fin heatsink, including at least the second base, the second surface, and a portion of the second fins.

6. The semiconductor device package of claim 1, wherein the first semiconductor die includes a transistor, and the second semiconductor die includes a diode.

7. The semiconductor device package of claim 6, wherein the transistor is an insulated gate bipolar transistor (IGBT), and the diode is a fast recovery diode (FRD).

8. A semiconductor device package, comprising:
a leadframe;
a substrate connected to the leadframe;
a first pin-fin heatsink connected to the substrate;
a first semiconductor die disposed on a patterned metal layer of the substrate;
a second semiconductor die disposed on the patterned metal layer of the substrate;
a clip electrically connected to the first semiconductor die and the second semiconductor die;
an electrically-isolating layer disposed on the clip;
a second pin-fin heatsink disposed on the clip with the electrically-isolating layer disposed therebetween; and
a mold material encapsulating the first semiconductor die, the second semiconductor die, the clip, and the electrically-isolating layer, and partially encapsulating the leadframe, the first pin-fin heatsink, and the second pin-fin heatsink,
wherein the first semiconductor die is flip-attached to the patterned metal layer of the substrate, and the first semiconductor die, the clip, and the second semiconductor die are connected in series.

9. The semiconductor device package of claim 8, wherein the first semiconductor die is soldered to the patterned metal layer of the substrate.

10. The semiconductor device package of claim 8, wherein the clip is soldered to the first semiconductor die and the second semiconductor die.

11. The semiconductor device package of claim 8, wherein the first pin-fin heatsink includes a first base with first fins attached thereto at a first surface of the first base, the first fins being parallel to one another and perpendicular to the first base, and further wherein the second pin-fin heatsink includes a second base with second fins attached thereto at a second surface of the first base, the second fins being parallel to one another and perpendicular to the second base.

12. The semiconductor device package of claim 11, wherein the mold material encapsulates the first pin-fin heatsink, including at least the first base, the first surface, and a portion of the first fins, and further wherein the mold material encapsulates the second pin-fin heatsink, including at least the second base, the second surface, and a portion of the second fins.

13. The semiconductor device package of claim 8, wherein the first semiconductor die includes a transistor, and the second semiconductor die includes a diode.

14. The semiconductor device package of claim 13, wherein the transistor is an insulated gate bipolar transistor (IGBT), and the diode is a fast recovery diode (FRD).

15. A semiconductor device package, comprising:
a leadframe;
a substrate connected to the leadframe;
a first pin-fin heatsink connected to the leadframe;
a first semiconductor die disposed on a patterned metal layer of the substrate;
a second semiconductor die disposed on the patterned metal layer of the substrate;
a clip electrically connected to the first semiconductor die and the second semiconductor die;
an electrically-isolating layer disposed on the clip; and
a second pin-fin heatsink disposed on the clip with the electrically-isolating layer disposed therebetween,
wherein the first semiconductor die is flip-attached to the patterned metal layer of the substrate, and the first semiconductor die, the clip, and the second semiconductor die are connected in series.

16. The semiconductor device package of claim 15, further comprising:
a mold material encapsulating the first semiconductor die, the second semiconductor die, the clip, and the electrically-isolating layer, and partially encapsulating the leadframe, the first pin-fin heatsink, and the second pin-fin heatsink.

17. The semiconductor device package of claim 16, wherein the first pin-fin heatsink includes a first base with first fins attached thereto at a first surface of the first base, the first fins being parallel to one another and perpendicular to the first base, and further wherein the second pin-fin heatsink includes a second base with second fins attached thereto at a second surface of the first base, the second fins being parallel to one another and perpendicular to the second base.

18. The semiconductor device package of claim 17, wherein the mold material encapsulates the first pin-fin heatsink, including at least the first base, the first surface, and a portion of the first fins, and further wherein the mold material encapsulates the second pin-fin heatsink, including at least the second base, the second surface, and a portion of the second fins.

* * * * *